United States Patent [19]
Dorfman

[11] Patent Number: 4,624,529
[45] Date of Patent: Nov. 25, 1986

[54] LIQUID CRYSTAL DISPLAY WITH CENTRAL INTERCONNECTIONS

[75] Inventor: Leonard M. Dorfman, Campbell, Calif.

[73] Assignee: Timex Corporation, Waterbury, Conn.

[21] Appl. No.: 672,037

[22] Filed: Nov. 16, 1984

[51] Int. Cl.[4] .......................... G02F 1/13; G04C 17/00
[52] U.S. Cl. ..................................... 350/334; 350/336; 368/30
[58] Field of Search ................ 350/334, 336; 368/242, 368/30

[56] References Cited

U.S. PATENT DOCUMENTS 4,079,369  3/1978  Fukumoto ........................... 368/242
4,243,455  1/1981  Shiba et al. ......................... 350/336

FOREIGN PATENT DOCUMENTS 0072416  6/1981  Japan .................................... 350/334

OTHER PUBLICATIONS

Bachoff, "Conductive Elastomers Make Small Flexible Contacts".

Primary Examiner—John K. Corbin
Assistant Examiner—David Lewis
Attorney, Agent, or Firm—William C. Crutcher

[57] ABSTRACT

A liquid crystal display adapted for a solid state analog timepiece has front and rear transparent substrates with radial transparent electrodes to represent hour, minute and second hands. The contact terminals connected to the electrodes are grouped in an array at the center of the front substrate. An elastomeric connector containing multiple discrete conductors extends through a center hole in the rear substrate to connect the array of contact terminals on the front substrate with a similar array of contact terminals on a printed circuit board behind the display. Liquid crystal material is sealed between the substrates both at the periphery of the display and around the central hole.

4 Claims, 6 Drawing Figures

LIQUID CRYSTAL DISPLAY WITH CENTRAL INTERCONNECTIONS

BACKGROUND OF THE INVENTION

This invention relates to liquid crystal displays adapted for timepieces, especially solid state analog timepieces having radial "hands" to display the time.

Conventional liquid crystal displays have front and rear transparent substrates with transparent electrodes or segments arranged to display information when actuated by signals from an electrical circuit. Liquid crystal displays of various types are well known in the art and, for example, may include liquid crystal material sealed between the substrates, and associated with one or more polarizers to provide the well-known twisted nematic, field effect, liquid crystal display.

Conventional liquid crystal displays are arranged with the contact terminals on the periphery of the display, usually on the underside an over-hanging edge of the top substrate as seen in U.S. Pat. No. 3,863,436—Schwarzschild, et al issued Feb. 4, 1975. Contact terminals have also been provided at the edges of the display as shown in U.S. Pat. No. 4,391,531—Yokota et al issued July 5, 1983. Both of these patents are assigned to the present assignee.

Liquid crystal displays with radial "hands" representing mechanical hour, minute and second hands have been proposed as seen in U.S. Pat. No. 3,540,209 to Zatsky, et al issued Nov. 17, 1970; and in British Patent Specification No. 1,472,260, these being merely exemplary. Timepieces using radial hand liquid crystal displays are sometimes called solid state analog or liquid crystal analog timepieces.

When constructing a liquid crystal display for a timepiece with radial members, it is desirable to use as much of the outer part of the display surface as possible, so that the "hands" can extend as far as possible from the center for ease of readability. The conventional placement of contact terminals on the outside edges of the display, especially when using the technique requiring an overlapping edge on the top substrate, reduces the effective display area which is available for visible segments. It would also be desirable to have more flexibility at the outer periphery of the display to use round, octagonal, oval or other shapes of display than rectangular.

Liquid crystal displays for solid state analog timepieces have been proposed in which the integrated circuit and quartz crystal were disposed on the underside of the upper display substrate. The proposed construction is described in *Inter Electronique*, dated Dec. 11, 1972, pages 33–36. Such an arrangement naturally leads to a very large central opening and difficult construction.

It has also been suggested to provide a liquid crystal display for a digital timepiece combined with mechanical analog hands carried on a stem extending through a central hole in the display. Such an arrangement is shown in British Published Patent Application No. GB 2 084 764A—Maliska, published Apr. 15, 1982, assigned to the present assignee.

Accordingly, one object of the present invention is to provide an improved liquid crystal display for a solid state analog timepiece which increases the availability of display area at the outer part of the display.

Another object of the invention is to provide an improved liquid crystal display with improved means to connect the display to an external circuit which permits greater flexibility to choose the shape of the display.

DRAWINGS

The invention, both as to organization and method of practice, together with other objects and advantages thereof, will best be understood by reference to the following description, taken in connection with the accompanying drawings, in which.

SUMMARY OF THE INVENTION

Briefly stated, the invention is practiced by providing a liquid crystal display having transparent radial segments on an upper substrate connected to an array of contact terminals in a central portion of the upper substrate. The array of terminals is accessible through a central hole in a second substrate also having transparent electrodes. Liquid crystal material is sealed between the substrates at the periphery and around the hole. An elastomeric connector having a plurality of discrete conductors embedded therein is adapted to provide contact between the array of contact terminals on the upper substrate and an array of aligned contact terminals on the printed circuit board.

DESCRIPTION OF THE PREFERRED EMBODIMENT

Figure 1:
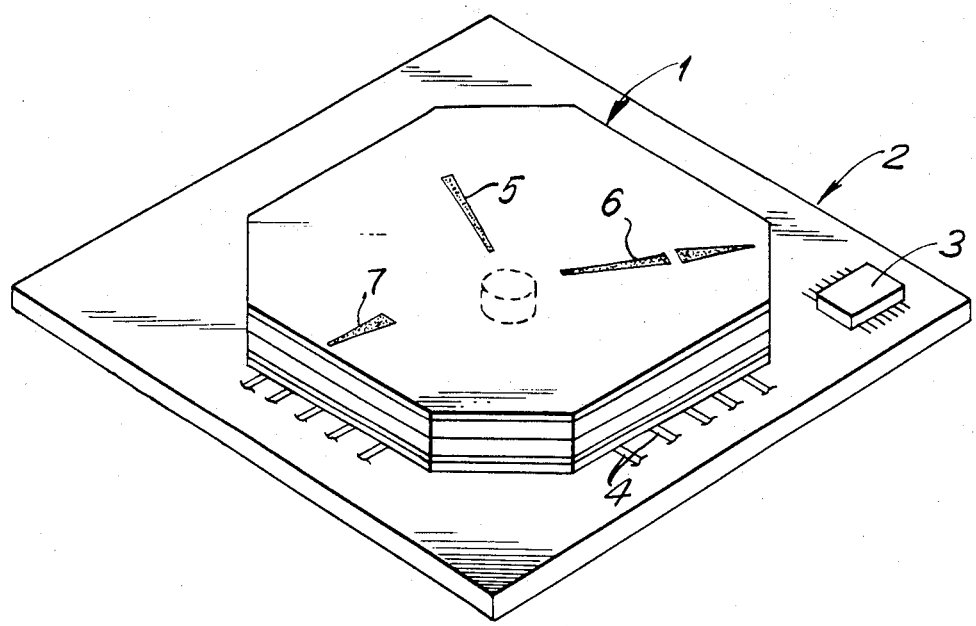
FIG. 1 is a schematic perspective view of a solid state analog liquid crystal display mounted on a printed circuit board.

Referring now to FIG. 1 of the drawing, a liquid crystal display shown generally as 1 is mounted on a printed circuit board, shown generally as 2. The overall shape of the printed circuit board 2 is not material to the present invention, and it can be larger than, smaller than or the same size as display 1 in order to suit a particular application. Printed circuit board 2 serves to mount an integrated circuit 3 for timekeeping and to actuate the display. The integrated circuit 3 has output pins for connecting its LCD driving circuit to display 1 over conductive tracks 4 on the printed circuit board. Display 1 displays the time, in accordance with signals received from integrated circuit 3 in analog timekeeping fashion by means of an hour "hand" 5, a minute "hand" 6 and a seconds marker 7, in a manner well known in the art.

Figure 2:
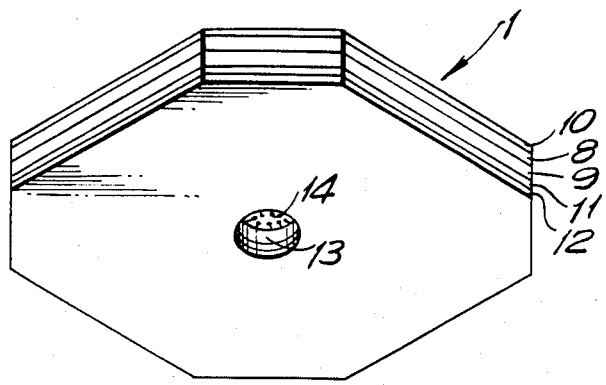
FIG. 2 is a schematic perspective view of the underside of the display.

Display 2, as more clearly seen in FIG. 2 comprises an upper glass substrate 8, and a lower glass substrate 9 with a liquid crystal material sealed between the substrates. An upper polarizer sheet 10 and a lower polarizer sheet 11 are disposed above and below substrate 8 and 9 respectively. A reflector 12 is disposed below the polarizer 11. In accordance with the present invention, the lower members, substrate 9, polarizer 11 and reflector 12 are pierced at the center with a hole 13, so as to expose an array 14 of contact terminals on the underside of upper substrate 8.

Figure 3:
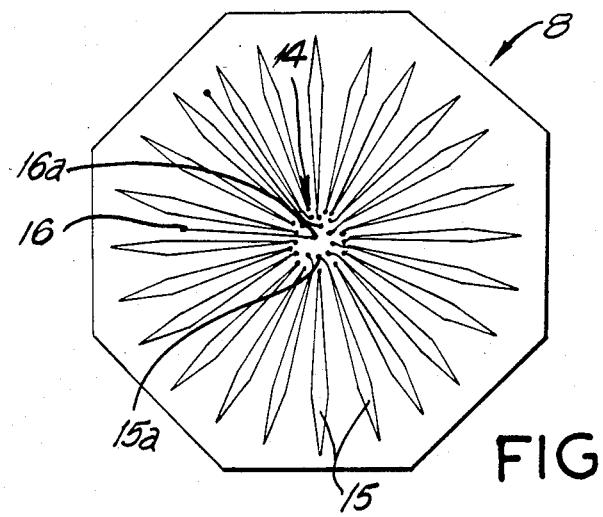
FIG. 3 is a bottom plan view of the upper display substrate.

Referring to FIG. 3 of the drawing, substrate 8 is shown to have an octagonal outer perimeter with radial transparent electrodes 15. Each electrode 15 is connected at its inner end to a contact terminal 15A, which is part of array 14.

In order to make crossover connections from the other substrate, crossover connection terminals such as 16 located between electrodes 15 are each connected to a contact terminal 16a in the central array 14 of terminals.

Figure 4:
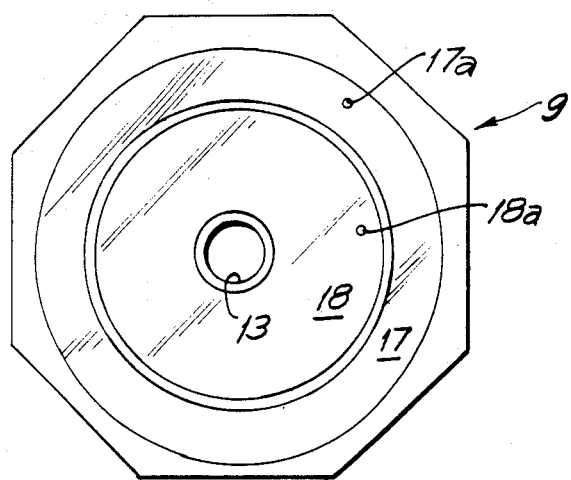
FIG. 4 is a top plan view of the lower display substrate.

Reference to FIG. 4 shows that the lower substrate 9 is provided with a pair of circular concentric transparent electrodes 17, 18 around the center hole 13. Crossover connections 18a, 17a are arranged to match up with the crossover connections 16 on the upper substrate when the two plates are aligned. In this way, in a manner known in the art, the electrodes 17 and 18 on substrate 9 are connected to the central array 14 of terminals on substrate 8.

Figure 5:
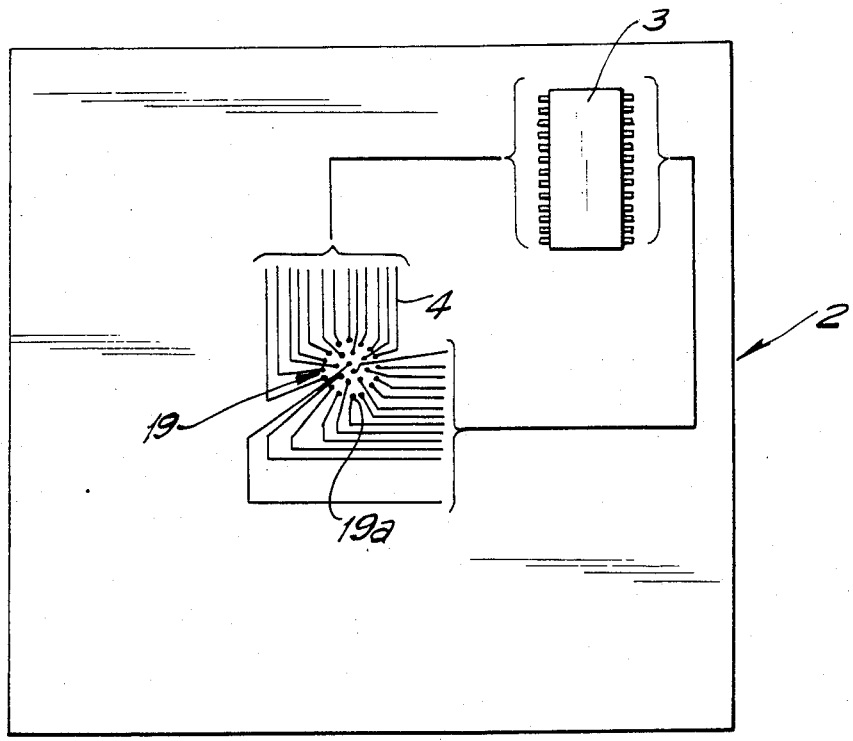
FIG. 5 is a top plan view of portions of a printed circuit board for mounting the display.

Referring to FIG. 5, the printed circuit board 2 has an array 19 of conductive dots 19a serve as contact terminals, which are individually connected by leads or conductive tracks 4 on the printed circuit board to the integrated circuit 3. The array 19 of contact terminals on the printed circuit board is precisely arranged to match the array 14 on the under side of upper substrate 8.

Figure 6:
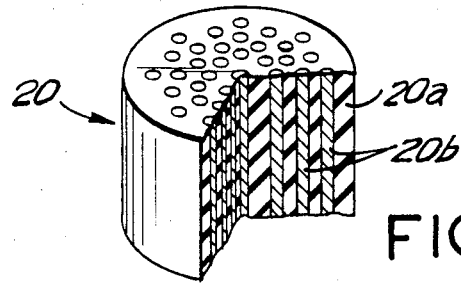
FIG. 6 is an enlarged perspective view, partly in section, of a connector employed in the present invention.

FIG. 6 shows a connector 20 which comprises an elastomeric insulating substance 20a having a plurality of embedded discrete conductors 20b. Such an elastomeric material with parallel discrete conductors is commercially available in sheets, one source being Shin-etsu Polymer America, Inc. The connector 20 is cut from the sheet in a circular shape so that it will fit hole 13 and, when the display is aligned so that the array 14 is precisely matched with array 19 on the board, each of the contact terminals on the upper substrate of the display will be connected with a corresponding contact terminal on the printed circuit board. The elastomer 20a is compressible to permit good terminal contact. Suitable means (not shown) for positioning and locating the display with respect to the printed circuit board will be apparent to those skilled in the art. It should be apparent that the array of terminals 19 should be precisely a mirror image of the array 14. The number and arrangement of discrete conductors 20b in the connector 20 must be selected to interconnect the individual contact terminals, which are spaced from and aligned with one another in respective pairs, ie. a terminal in one array with its respective counterpart in the other array. For some applications, one discrete conductor per terminal will suffice. However the density of discrete conductors may be much greater, for example 3 conductors per contact terminal.

Application of an electrical potential between appropriate radial segments on one substrate and the concentric segments on the other substrate permits showing hours, minutes and seconds, as described more fully in the aforementioned Zatsky patent or British Patent Specification No. 1,472,260, which are incorporated herein by reference. While there has been disclosed what is considered to be the preferred embodiment of the invention, other modifictions will occur with those skilled in the art, and it is desired to include in the appended claims all such modifications as fall within the true spirit and scope of the invention.

I claim:

1. Improvement in a liquid crystal display for a solid state analog timepiece, said display having upper and lower spaced substrates with liquid crystal material sealed therebetween and having a plurality of opposed transparent electrodes on the substrates, the improvement comprising a plurality of radial electrodes on the upper substrate, a plurality of contact terminals arranged in a first array on the central portion of said upper substrate and each connected to one of said radial electrodes, said other substrate defining a central hole therethrough providing access to said first array, and elastomeric connector means disposed in said hole and having a plurality of imbedded discrete conductors making contact with said contact terminals.

2. The improved display in accordance with claim 1, wherein said upper substrate includes crossover connections connected to contact terminals disposed in said array and wherein said electrodes on the lower substrate are connected between substrates to said crossover connections.

3. The improved display in accordance with claim 1, wherein the display includes a lower polarizer and reflector having central holes therethrough aligned with the lower substrate central hole, and wherein said connector extends through said central holes.

4. The improved display according to claim 1 and further including means providing a second array of contact terminals aligned with said first array, said discrete conductors in the connector being arranged to connect the contact terminals in respective pairs from the first and second arrays.

* * * * *